(12) United States Patent
Budd et al.

(10) Patent No.: US 6,603,149 B2
(45) Date of Patent: Aug. 5, 2003

(54) HIGHLY EFFICIENT OLED DEVICE

(75) Inventors: Russell Alan Budd, North Salem, NY (US); George Liang-Tai Chiu, Cross River, NY (US); Richard Alan Haight, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/881,376

(22) Filed: Jun. 14, 2001

(65) Prior Publication Data

US 2001/0030320 A1 Oct. 18, 2001

Related U.S. Application Data

(63) Continuation-in-part of application No. 09/162,016, filed on Sep. 28, 1998, now abandoned.

(51) Int. Cl.⁷ .............................................. H01L 33/00
(52) U.S. Cl. ............................ 257/98; 257/99; 257/100; 257/88
(58) Field of Search ........................... 257/40, 88, 89, 257/91, 98, 99, 100; 362/296, 341

(56) References Cited

U.S. PATENT DOCUMENTS

| 5,119,174 A | 6/1992 | Chen | 257/99 |
| 5,739,545 A | 4/1998 | Guha et al. | 257/40 |

OTHER PUBLICATIONS

J. Gower, "Optical Communication Systems, "Prentice Hall, Englewood Cliffs, New Jersey, p. 244 (1984).
T. Sano, et al., Extended Abstracts, 41st Spring Meeting, Japan Society of App. Phys. No. 3, p. 1070 (1994).
P.E. Burrows, et al. "Relationship Between Electrouminescene and Current Transport in Organic Heterojunction Light–Emitting Devices, "J. Appl. Phys., vol. 79, No. 10, pp. 791–8006 (May 15, 1996).
P.E. Burrows, et al., "Acheiving Full–Color Organic Light–Emitting Devices for Lightweight, Flat–Panel Displays," IEEE Transactions on Electron Devices, vol. 44, No. 8, pp. 1188–1203 (Aug. 1997).
C. Hosokawa, et al., "L2.3: Organic Multicolor EL Display With Fine Pixels," SID 97 Digest, pp. 1073–1076 (1997).
R.Y. Pai, "27.1: Invited Paper: Efficiency Limits for Fluorescent Lamps and Application to LCD Backlighting," SID 97 Digest, pp. 447–450 (1997).

*Primary Examiner*—Minh Loan Tran
(74) *Attorney, Agent, or Firm*—Scully, Scott, Murphy & Presser; Daniel P. Morris, Esq.

(57) ABSTRACT

An OLED device which is capable of utilizing light transmitted from the sides of the OLED as well as the surface of the OLED is provided. The OLED device comprises an OLED having a substrate surface and sides for emission of photons therethrough and at least one adjacent light-folding means, wherein said light-folding means collects and redirects photons emitted from the sides of the OLED into coincident paths of light which are substantially parallel to said photons emitted from said substrate surface.

25 Claims, 3 Drawing Sheets

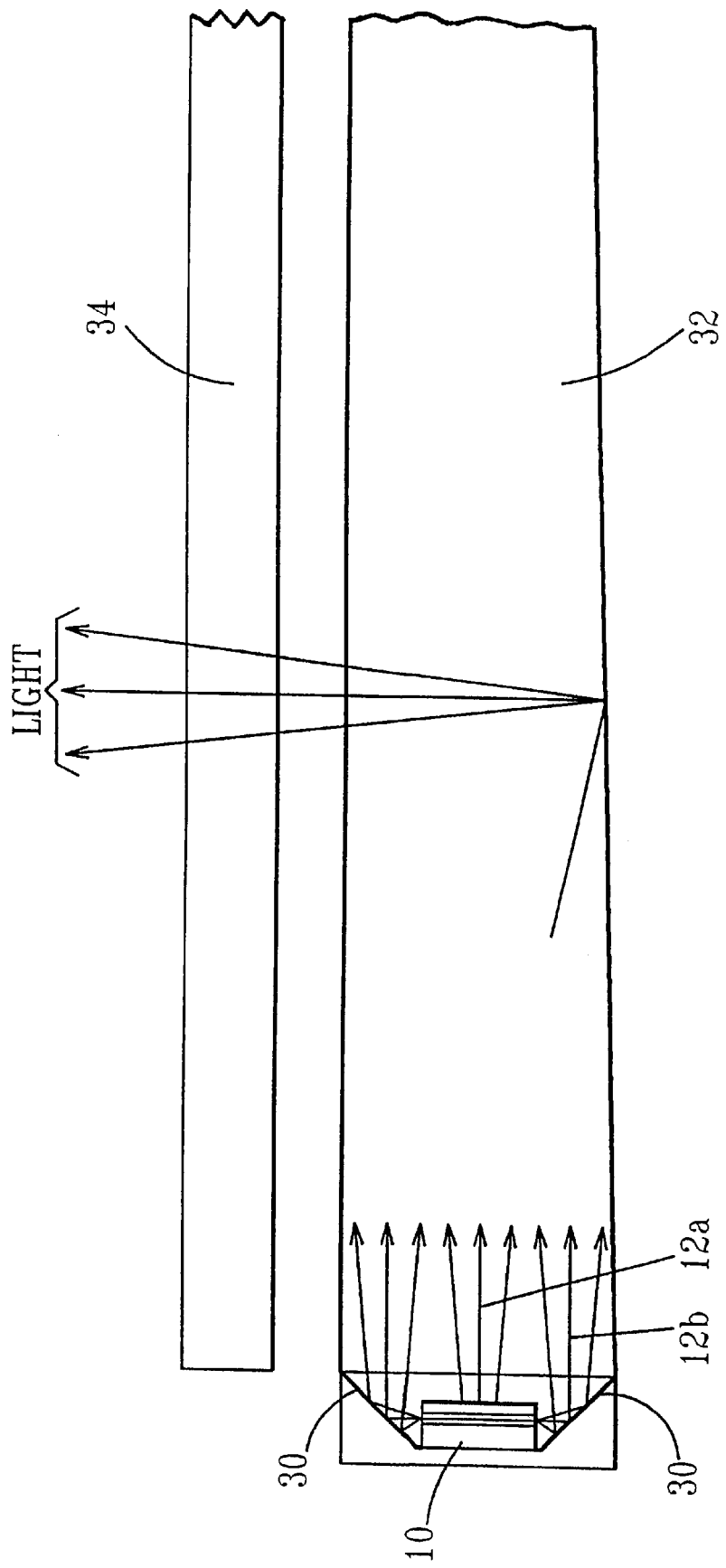

HIGHLY EFFICIENT OLED DEVICE

CROSS REFERENCE TO RELATED APPLICATION

This application is a continuation-in-part of U.S. patent application Ser. No. 09/162,016 filed Sep. 28, 1998, now abandoned.

FIELD OF THE INVENTION

The present invention relates to organic light emitting diodes (OLEDs), and more particular to a modified OLED device wherein both edge emission and surface emission are used for backlighting. The modified OLED device of the present invention is a low weight, thin, and highly efficient backlight for use in a variety of displays, such as direct-view flat panel or virtual displays.

BACKGROUND OF THE INVENTION

OLEDs are based on amorphous organic films deposited on any substrate, including non-crystalline substrates. OLED organic materials provide much cheaper solar cells than their LED counterparts since crystalline or epitaxially grown inorganic materials, required materials for LEDs, are costly. OLED organic films are typically very thin (on the order of about 50–100 nm, i.e., 500–1000 Å) with respect to their LED counterparts, and combined with large Franck-Condon shift between absorption and emission, this slenderness makes them transparent to their own emission. Such transparency, in addition to the fact that the deposition of organic compounds in a vacuum may provide for large-area or custom shaped cells, makes novel display architectures and applications a propensity of OLED configurations.

In comparing an LED configuration to an OLED device it is important to note clear-cut differences in efficiency. OLEDs can achieve very high brightness of greater than 15,000 cd/m$^2$ and have operational lifetimes greater than 10,000 hours when driven at video brightness (100 cd/m$^2$) according to the Kirk-Othmer Encyclopedia of Chemical Technology, Fourth Edition, Supplemental volume, pages 488–495 (especially page 488). Thus, when merely based upon efficiency, there is a clear desire for more OLED technology.

A semiconductor LED structure matrix display is described in detail in U.S. Pat. No. 5,119,174 to Chen wherein it is taught that an LED crystal display maintaining bowl-punched die attachment zones on a printed circuit board (PCB) creates a reflector surface to concentrate the light emitting from the LED. However this LED is problematic in that the light, being matrixed, is incapable of being directed in a collimated manner and thus this device may not achieve the desired brightness. If such light were to be collimated, a grave concern arises as to the dispensation of the heat that would be produced.

The efficiency of a cold cathode fluorescent lamp has been reported by R. Y. Pai, "Efficiency Limits for Fluorescent Lamps and Applications to LCD Backlighting," SID '97 Digest, pp. 447–450, 1997, to be within the range from about 30 to about 80 lumens/watt (lm/W). On the other hand, the best efficiency of OLEDs reported in the literature are green: 16 lm/W, see, for example, T. Sano, et al., Extended Abstracts, 41$^{st}$ Spring Meeting, Japan Soc. of App. Phys., No. 3, p. 1073, 1994, blue: 6 lm/W, see, for example, C. Hosokawa, et al., "Organic Multicolor EL Display with Fine Pixels," SID '97 Digest, pp. 1073–1076, 1997, and red: 2 lm/W, see, for example, P. E. Burrows, et al., "Achieving Full-Color Organic Light-Emitting Devices for Lightweight, Flat Panel Displays," IEEE Transactions on Electron Devices, V.44, No. 8, pp. 1188–1203, 1997, respectively. In contrast to cold cathode fluorescent lamps, a white OLED combining these sources can only achieve an efficiency within the range of from about 15 to about 20 lm/W. A factor of 2 improvement in efficiency would enable OLEDs to compete with cold cathode fluorescent lamps in the future.

Furthermore, the on/off time of OLEDs is typically a microsecond or less, which is well-suited for time sequential red, blue, green illumination. This opens up the possibility of having color-filterless displays. The advent of such color-filterless displays having high efficiency would provide substantial savings for current color-filtered displays, a savings which could be passed along to the consumer.

Unlike semiconductor light emitting diodes, OLEDs exhibit substantially no resonant self-absorption because the peaks of the absorption band and emission band are separated by 0.4 eV, see, for example, P. E. Burrows, et al., "Relationship Between Electroluminescence and Current Transport in Organic Heterojunction Light-Emitting Devices," J. App. Phys. 79(10), p. 7991, May, 15, 1997.

Prior art OLEDs of the type shown in FIGS. 1(a) and (b) are exclusively made to be surface-emitting diodes. Specifically, FIG. 1(a) shows an OLED structure where the anode is on top adjacent to the light emitting surface. Another type of structure as is shown in FIG. 1(b), where the cathode is on top, is described in detail in U.S. Pat. No. 5,739,545 to Guha, et al.

An advantage of these structures in FIGS. 1(a) and (b) is that they are easily fabricated in conventional silicon manufacturing facilities and may contain support circuitry in the silicon below the OLED structure. However, due to the fact that the OLED active layer (light generating layer) is fairly transparent relative to an LED active (or light generating) layer, some of the light that is confined within the light-generating layer is then transported (waveguided) to the edges of the chip and emitted. With an inorganic LED active layer this light would be mostly absorbed. However, prior art OLEDs in their current form meet the requirements for several low-resolution applications due to this loss of light via natural waveguidance but have yet to achieve higher resolution applicability.

In view of the inefficiencies of the prior art OLEDs, there is a continued need to develop new and improved OLED devices which increase illumination via an increase in the throughput of photons which would otherwise escape the OLED.

SUMMARY OF THE INVENTION

Accordingly, the present invention is directed to an organic light emitting diode (OLED) device comprising a substrate surface and sides for emission of photons therethrough and at least one adjacent light-folding means, wherein said adjacent light-folding means collects and redirects photons emitted from the sides of the OLED into coincident paths of light which are substantially parallel to the photons emitted by said substrate surface.

One object of the present invention is to provide an OLED device that has a higher optical efficacy as compared with prior art OLED devices.

Another object of the present invention is to provide an OLED device which has increased illumination as compared with prior art OLEDs.

A still further object of the present invention is to provide an OLED device which maintains a wave guide layer which guides light to the edges of the structure.

These and other objects and advantages are achieved by the present invention by utilizing an OLED device which combines the edge emission of photons with the normal surface emission of photons. By combining these two emission sources, the OLED device of the present invention exhibits high optical efficacy which is typically on the order of 2–3x above prior art OLEDs.

Specifically, the OLED device of the present invention comprises an OLED having a substrate surface and sides (or edges) for emission of photons therethrough and at least one adjacent light-folding means, wherein said adjacent light-folding means collects and redirects photons emitted from the sides of the OLED into coincident paths which are substantially parallel to the photons emitted through said substrate surface.

In another aspect of the present invention, a red, green and blue segmented OLED device for color sequential use is provided. In accordance with this aspect of the present invention, the color segmented OLED device comprises a plurality of color emitting OLEDs, each OLED having a substrate surface and sides for emission of photons therethrough, arranged sequentially in a predetermined order and at least one adjacent light-folding means, wherein said adjacent light-folding means collects and redirects photons emitted from the sides of the OLEDs into coincident paths which are substantially parallel to the photons emitted through said substrate surfaces.

Yet another object of the present invention is to provide an OLED device which can be used for providing time sequential pulses of various colors.

As a result of the teaching described herein, an OLED is able to be produced having the desired efficiency, brightness, and color stability that overcomes the disadvantages of the prior art.

BRIEF DESCRIPTION OF THE DRAWINGS

FIG. 2 is a side view of the OLED device of the present invention, wherein a light collecting and redirecting mirror is positioned adjacent the OLED.

DETAILED DESCRIPTION OF THE INVENTION

Figure 1A:
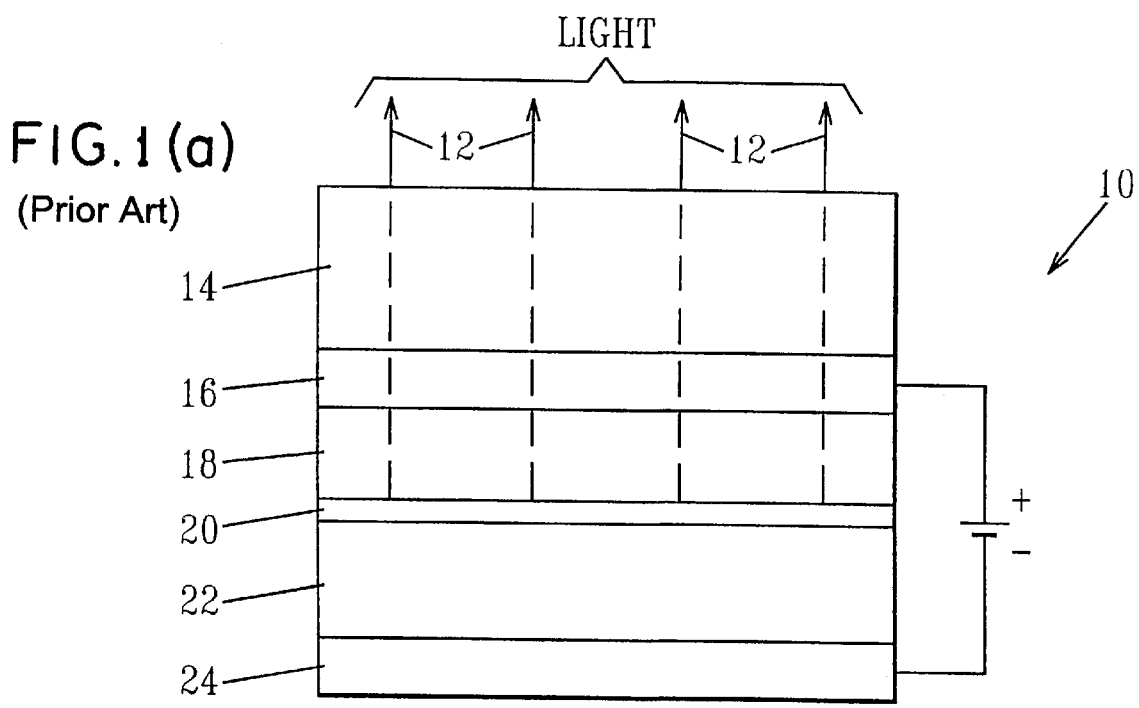
FIGS. 1(a)–(b) are cross-sectional views of prior art OLED structures which can be employed in the present invention.

The present invention provides an OLED device that combines the side emission of light from an OLED with the surface emission of light from an OLED and is now described in greater detail by referring to the drawings that accompanying this application. It should be noted that in the drawings like and/or corresponding elements are referred to by like reference numerals.

FIGS. 1(a) and (b) represent two different layering techniques of OLED surface emitting diodes. Specifically, FIG. 1(a) shows an anode atop the organic light emitting surface wherein the OLED structure 10 allows light 12 to escape from a top surface of the OLED through a glass substrate 14 wherein the glass substrate is typically coated with a transparent conducting layer 16. It should be noted that in FIG. 1(a) the OLED is rotated 180° from the way in which it was fabricated. Indium tin oxide (ITO) is the most widely used transparent conducting layer and possesses a work function of about 4.8 eV. As such, ITO and other conducting materials are used as the anode of the OLED device.

Atop conducting layer 16 is a hole transport material 18 such as a diamine-containing compound. A common diamine which is typically employed is triphenyldiamine. Other transport materials including small molecules and polymers have also been employed in prior art OLEDs. The diamine layer is deposited in order to facilitate hole injection. An emitting layer 20, such as quinacridone or doped tris (8-hydroxy quinoline)-Al (AlQ), is then formed on hole transport layer 18. An electron transport layer 22, such as tris (8-hydroxy quinoline) Al (AlQ), is formed atop emitting layer 20. Finally, a cathode 24 which is composed of a material having a small work function is deposited on electron transport layer 22. Typically, the cathode is fabricated from an alloy of Mg and Ag. Other variants include Li, lithium fluoride, lithium oxide and Al with a thin layer of Ca first deposited atop the AlQ. Li and Ca possess a lower work function to facilitate electron injection.

Electrons are injected into the AlQ layer and recombine with holes within the AlQ layer giving rise to light emission centered near 530 nm. The opaque or semitransparent metallic cathode reflects light back towards the organic layers. A typical organic layer such as AlQ has a refractive index of 1.7, and glass has a refractive index of 1.45. Because these refractive indices are higher than that of air (1.0), only 17% (given by the expression, $1/2n^2$ wherein n is the index of refraction of the material layer, see J. Gowar, "Optical Communication Systems," p. 244, Prentice Hall, Englewood Cliffs, N.J., 1984,) of the photons can escape to the external surface for illumination. G. Gu, et al., "High-External-Quantum-Efficiency Organic Light-Emitting Devices," Optics Letter, V. 22, No. 6, pp. 396–398, March 1997 has reported that 83% of the photons are trapped inside the organic and glass layers. The trapped photons travel a path perpendicular to that of light 12 escaping from the substrate surface of the OLED.

Figure 1B:
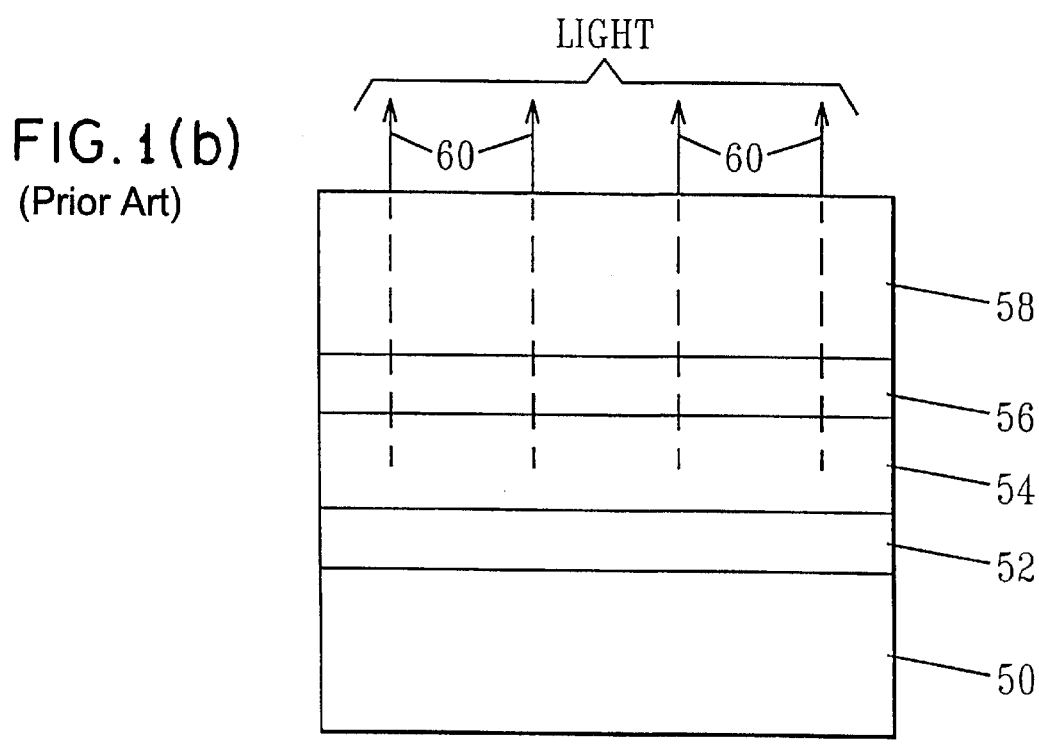

In another configuration, FIG. 1(b) represents a cathode atop the organic light emitting region wherein the OLED structure consists of a substrate 50, which may be a silicon material, an anode 52, an electroluminescent organic region 54, a thin metal 56, and a transparent or semitransparent cathode 58. Light 60 is emitted from the top, whereas some of the light is guided (by 50 and 56) along layer 54 until it exits the edge of the device. This is refered to as a waveguide since the index of refraction of adjacent layers 50 and 56 is higher than the OLED active layer. This acts to channel some of the light between these layers to the edge of the device. The mirrors then reflect the light towards the backlight.

The width of the OLED of the present invention is large with respect to LEDs of the prior art and thus is able to take advantage of the waveguiding of the OLED. Such a waveguide effect is not possible with semiconductor LEDs. Thus the light is directed in a collimated manner.

The active layer of the organic LED of the present invention has been intentionally widened in order to capitalize on the waveguiding nature of the OLED. By doubling the width of the active layer it becomes possible to increase the light output by up to a factor of two. The OLED active layer (light generating layer), being fairly transparent relative to an LED active (or light generating) layer, allows some of the light that is confined within the light generating layer to be then transported (waveguided) to the edges of the chip and emitted. With an LED active layer this light would be mostly absorbed. Thus the present invention invokes the use of structure to redirect the light guided to the edges of the chip, thus decreasing the amount of lost light emitted therein.

For example, when 2 substantial emission is from the edges of the device, widening of the OLED increases the intensity of emission. The light generated in the emission layer travels along that layer since its index is higher than the neighboring layers. Hence in effect a waveguide exists which guides the light to the edges of the structure.

The active layer of the OLED may be produced fairly wide in order to increase the brightness output of the present invention. The active layer can be anywhere from about 1 mm to about 20 mm wide. Preferably, the active layer width is within the range of about 1 mm to about 10 mm. Most preferably the active layer width is 5 mm.

It is also emphasized that the OLED employed in the present invention is not limited to certain materials discussed above in regard to FIGS. 1(a)–(b). Instead, the materials employed in fabricating the OLED can include any that are commonly employed in the prior art which serves the various functions mentioned above. Thus, OLED 10 can include numerous types of conducting electrodes, hole transparent materials, emitting materials, electron transparent materials and opaque or semitransparent metallic materials. It is further emphasized that OLED 10 is fabricated using conventional methods that are well known to those skilled in the art.

With regard to the particular structure of the present invention, attention is now directed to FIG. 2 wherein a side view of the OLED device of the present invention is shown. Specifically, the OLED device shown in FIG. 2 comprises an OLED 10 and light-folding means 30 for collecting and redirecting light emitted from the sides, i.e. edges, of the OLED 10. OLED 10 comprises any conventional OLED known to those skilled in the art. Thus, the OLED shown in FIGS. 1(a), 1(b), as well as others can be employed in the present invention.

When a potential, i.e. voltage, is applied to the device, electrons are emitted from emitting layer 20 where they are injected into electron transport layer 22 and recombined with the holes present therein giving rise to light emission. The opaque or semitransparent metallic cathode reflects the light back towards the organic layers and the reflected light is then transmitted through the surface of the OLED. During the course of the same, some of the reflected light gets trapped within the OLED and is directed to the sides of the OLED. The present invention utilizes the adjacent light-folding means to collect and redirect the photons being emitted from the sides of the OLED. These photons 12b are combined with the photons 12a being emitted through the substrate surface to provide higher light output than prior art OLEDs.

Light-folding means 30 which is positioned adjacent to OLED 10 includes any means which is capable of collecting light, i.e. photons, emitted from the sides of OLED 10 and redirecting the same into coincident beams which are substantially parallel to the light emitted from the surface of the OLED containing the coated glass substrate. Suitable light-folding means include: mirrors, prisms and other like reflecting materials.

It should be noted that although the drawings depict the presence of a single light-folding means the present invention also contemplates more than one light-folding means. It is also within the contemplation of the present invention to utilize a light-folding means which contains a 45° mirror adjacent one edge of the OLED 10 and a reflecting mirror on the other adjacent edge of the OLED 10.

Although not critical to the present invention, the light-folding means 30 is typically positioned from about 0 to about 10 mm, more preferably from about 1 to about 2 mm, from the OLED 10. It is again emphasized that the light-folding means 30 employed in the present invention must be positioned in the path in which the light emitted from the sides of the OLED 10 travels.

It is noted that by employing the OLED device of the present invention a greater optical efficiency is achieved. Typically, while only 17% of the light is transmitted by prior art OLEDs, the employment of the light-folding means to capture and redirect the light escaping from the sides, i.e. edges, of the OLED improves the above value to about 30 to about 50%. Thus, the present invention provides a 2–3x improvement over prior art OLEDs which do not utilize a light-folding means to capture and redirect the light emitted from the sides of the OLED.

Figure 3:
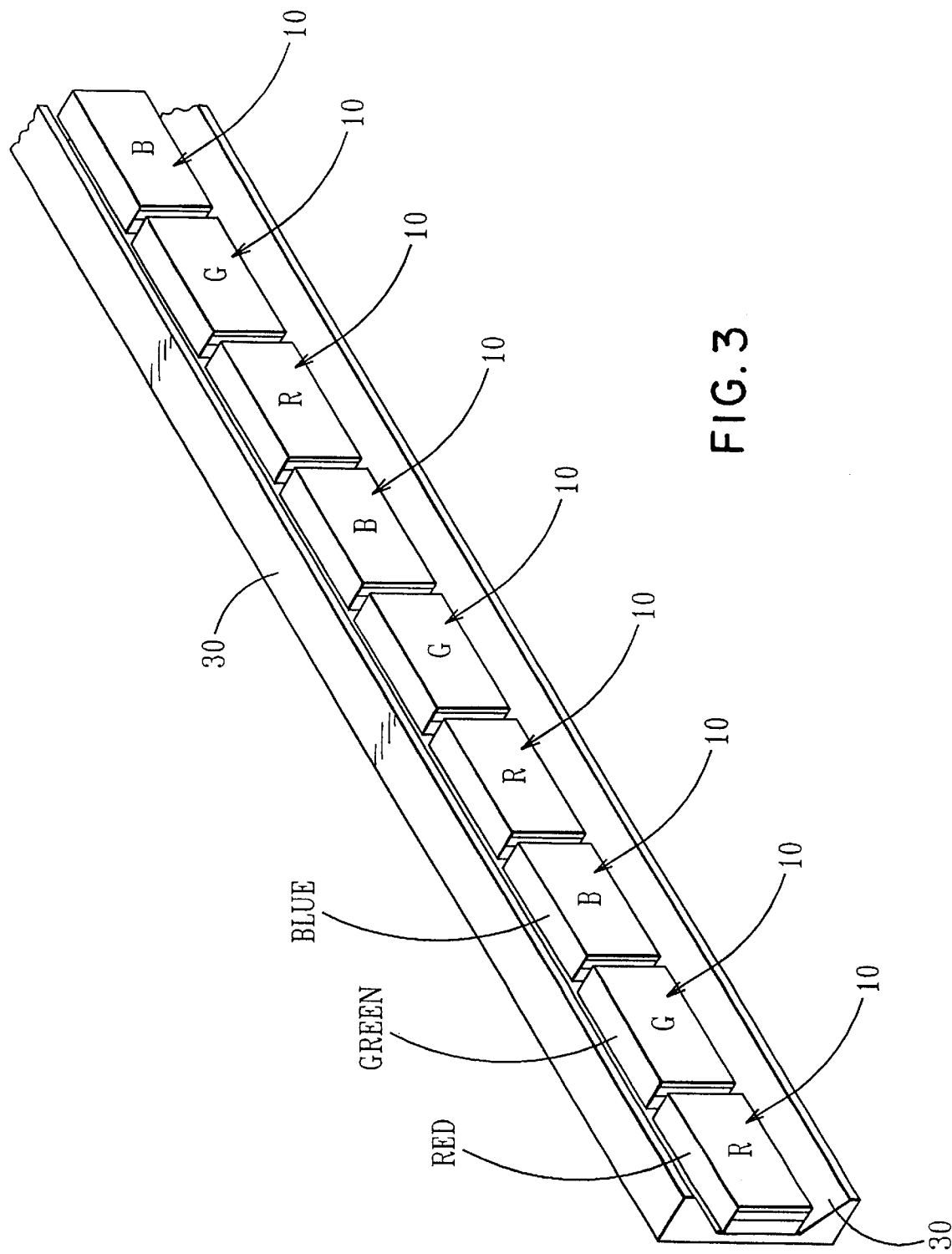
FIG. 3 is a side view of a red, green, blue (R, G, B) segmented OLED device of the present invention.

By making the OLED in a long strip a line illuminator is produced, which is ideal for many backlight display applications as shown in the application. As shown in FIG. 3, the length of the strip corresponds to the width of a backlight or display. An LCD display is normally edge lit, or lit from the edge of the display. However, here the florescent lamp is replaced with the structure shown in FIG. 3.

In addition to the above, the OLED device of the present invention optimally includes a light pipe 32 for collecting the OLED light as well as a display means 34 for utilizing the collected light illuminated by light pipe 32. The display means 34 of the OLED device 10 of the present invention are well known to those skilled in the art; therefore a detailed description of the same is not necessary herein. However, the light pipe works by utilizing unfocused transmissions and reflections to reduce photon losses. Such an OLED has a high index waveguide structure which tunnels the light along the active layer leading to a strong emission from the edges of the device. Therefore, the light is more collimated, that is, confined within a narrower range of emission angles, primarily perpendicular to the edge. Absence of such a waveguide effect leads to imperfect and inefficient collimation of the light and thus is not practical for any backlight applications.

In another aspect of the present invention, a segmented OLED device 10 for color sequential use is provided. This aspect of the present invention is also shown in FIG. 3. Specifically, FIG. 3 comprises a plurality of color emitting OLEDs 10 which are arranged in a predetermined color sequence. Illustratively, OLEDs 10 are arranged in the order of red (R), green (G), blue (B), red (R), green (G), blue (B), red (R), green (G), blue (B), etc. Light-folding means 30 is positioned adjacent color emitting OLEDs 10 so as to capture and redirect color light that is being emitted from the sides of the OLEDs. A sequence of colored light is provided by providing short pulses of a specific colored light through the OLEDs.

While the present invention has been particularly shown and described with respect to preferred embodiments thereof, it will be understood by those skilled in the art that the foregoing and other changes in form and detail may be made without departing from the scope and spirit of the present invention. It is therefore intended that the present invention not be limited to the exact forms described and illustrated, but fall within the scope of the appended claims.

Having thus described our invention in detail, what we claim as new, and desire to secure by the Letters Patent is:

1. An organic light emitting diode (SLED) device comprising:

a substrate surface and side edges for emission of photons therethrough;

a waveguide layer for guiding photons to said side edges for collimated emission thereof; and, at least one light-folding means adjacent to said SLED device, wherein said adjacent light-folding means collects and redirects the photons emitted from the sides of the OLED into coincident paths of light which are substantially parallel to the photons emitted by said substrate surface including paths perpendicular to said substrate surface, thereby increasing throughput of photons and luminosity of the OLED device.

2. The OLED device of claim 1 wherein said light-folding means is a mirror or prism.

3. The OLED device of claim 1 wherein said light-folding means directs light towards a back light or display.

4. The OLED device of claim 3 wherein said display is a flat panel or virtual display.

5. The OLED device of claim 1 further comprising a light pipe for collecting the light illuminated from said OLED and for transmitting the same to an adjacent display.

6. The OLED device of claim 1 wherein said OLED comprises a conducting material formed on said substrate, a hole transport layer formed on said conducting material, an emitting layer formed on said hole transport layer, an electron transport layer formed on said emitting layer, and a metallic cathode.

7. The OLED device of claim 6 wherein said metallic cathode is opaque or semitransparent.

8. The OLED device of claim 7 wherein light emitted toward said metallic cathode is reflected by said surface and reemitted towards said substrate surface.

9. The OLED device of claim 6 wherein said device comprises a surface emitting diode.

10. The OLED device of claim 1 wherein said OLED is capable of emitting a specific predetermined color.

11. The OLED device of claim 10 wherein said specific predetermined color is red, green or blue.

12. The OLED device of claim 1 wherein said OLED comprises an anode formed on said substrate, an electroluminescent organic region formed on said anode, a thin metal formed on said organic region and a transparent or semi transparent cathode.

13. The OLED device of claim 12 wherein said metallic cathode is opaque or semitransparent.

14. The OLED device of claim 13 wherein light emitted toward said metallic cathode is reflected by said surface and reemitted towards said substrate surface.

15. The OLED device of claim 14 wherein said device comprises a surface emitting diode.

16. The OLED device of claim 12 wherein said OLED is capable of emitting a specific predetermined color.

17. An organic light emitting diode (OLED) device comprising:

a substrate surface and side edges for emission of photons therethrough;

a waveguide layer for guiding photons to said side edges for collimated emission thereof; and at least one light-folding means adjacent to said OLED device, wherein a light generating layer of said OLED is about 1 mm to about 20 mm wide and said adjacent light-folding means collects and redirects photons emitted from the sides of the OLED into coincident paths of light which are substantially parallel to the photons emitted by said substrate surface, thereby increasing throughput of photons and luminosity of the OLED device.

18. The OLED device of claim 17 wherein said OLED active layer is about 1 mm to about 10 mm wide.

19. A color segmented SLED device for color sequential use comprising;

a plurality of color emitting OLEDs, each of said color emitting OLEDs having a substrate surface and side edges for emission of photons therethrough, and arranged sequentially in a predetermined order, and, a waveguide layer for guiding photons to said side edges for collimated emission thereof; and at least one light-folding means adjacent to said OLED device capable of collecting and redirecting photons emitted from the sides of the OLEDs into coincident beams which are substantially parallel to photons which are emitted by the substrate surfaces of said plurality of said color emitting OLEDs including paths perpendicular to said substrate surface, thereby increasing throughput of photons and luminosity of the OLEDs.

20. The color segmented OLED device of claim 19 wherein said light-folding means is a mirror or prism.

21. The color segmented OLED device of claim 19 further comprising a light pipe for collecting the light illuminating from said OLEDs and for transmitting the same to an adjacent display.

22. The color segmented OLED device of claim 21 wherein said display is a flat panel or virtual display.

23. The color segmented OLED device of claim 19 wherein said OLED comprises a conducting material formed on said substrate, a hole transport layer formed on said conducting material, an emitting layer formed on said hole transport layer, an electron transport layer formed on said emitting layer and an opaque metallic cathode.

24. The color segmented OLED device of claim 23 wherein said metallic cathode is opaque or semitransparent.

25. The color segmented OLED device of claim 24 wherein light emitted toward said metallic cathode is reflected by said surface and reemitted towards said substrate surface.

* * * * *